(12) United States Patent
Xie et al.

(10) Patent No.: US 11,495,538 B2
(45) Date of Patent: Nov. 8, 2022

(54) FULLY ALIGNED VIA FOR INTERCONNECT

(71) Applicant: International Business Machines Corporation, Armonk, NY (US)

(72) Inventors: Ruilong Xie, Niskayuna, NY (US); Christopher J. Waskiewicz, Rexford, NY (US); Chih-Chao Yang, Glenmont, NY (US); Lawrence A. Clevenger, Saratoga Springs, NY (US); Ashim Dutta, Menands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/932,731

(22) Filed: Jul. 18, 2020

(65) Prior Publication Data
US 2022/0020688 A1    Jan. 20, 2022

(51) Int. Cl.
| H01L 23/528 | (2006.01) |
| H01L 23/522 | (2006.01) |
| H01L 21/768 | (2006.01) |
| H01L 23/532 | (2006.01) |

(52) U.S. Cl.
CPC .... *H01L 23/5283* (2013.01); *H01L 21/76897* (2013.01); *H01L 23/5226* (2013.01); *H01L 23/53242* (2013.01); *H01L 23/53257* (2013.01)

(58) Field of Classification Search
CPC ............. H01L 23/5283; H01L 23/5226; H01L 23/53242; H01L 23/53257; H01L 21/76897

USPC ....................................................... 257/774
See application file for complete search history.

(56) References Cited

U.S. PATENT DOCUMENTS

| 8,299,625 B2 | 10/2012 | Ponoth et al. |
| 9,324,650 B2 | 4/2016 | Edelstein et al. |
| 9,793,163 B2 | 10/2017 | Bristol et al. |
| 9,953,865 B1 | 4/2018 | Briggs et al. |
| 9,966,337 B1 | 5/2018 | Briggs et al. |
| 10,177,028 B1 | 1/2019 | LiCausi et al. |
| 10,395,986 B1 * | 8/2019 | Briggs .............. H01L 21/76816 |
| 2015/0056800 A1 | 2/2015 | Mebarki et al. |

(Continued)

OTHER PUBLICATIONS

Benjamin D. Briggs et al., "Fully aligned via integration for extendibility of interconnects to beyond the 7 nm node," International Electron Devices Meeting (IEDM), Dec. 2017, 14.2, 4 pp.

*Primary Examiner* — Tu-Tu V Ho
(74) *Attorney, Agent, or Firm* — L. Jeffrey Kelly; Michael J. Chang, LLC

(57) ABSTRACT

A fully aligned via interconnect structure and techniques for formation thereof using subtractive metal patterning are provided. In one aspect, an interconnect structure includes: metal lines Mx−1; metal lines Mx disposed over the metal lines Mx−1; and at least one via Vx−1 fully aligned between the metal lines Mx−1 and the metal lines Mx, wherein a top surface of at least one of the metal lines Mx−1 has a stepped profile. In another aspect, another interconnect structure includes: metal lines Mx−1; metal lines Mx disposed over the metal lines Mx−1; at least one via Vx−1 fully aligned between the metal lines Mx−1 and the metal lines Mx; and sidewall spacers alongside the metal lines Mx. A method of forming an interconnect structure is also provided.

14 Claims, 15 Drawing Sheets

(56) References Cited

U.S. PATENT DOCUMENTS

2018/0315654 A1 11/2018 Briggs et al.
2019/0019726 A1 1/2019 Ryan et al.

* cited by examiner

FULLY ALIGNED VIA FOR INTERCONNECT

FIELD OF THE INVENTION

The present invention relates to interconnect structures, and more particularly, to a fully aligned via interconnect structure and techniques for formation thereof using subtractive metal patterning.

BACKGROUND OF THE INVENTION

Interconnect structures having metal lines and vias are typically formed using a so-called dual damascene process whereby features such as trenches and vias are first patterned in a dielectric. The features are then lined with a barrier layer, and filled with a metal over the barrier layer. There are, however, some notable drawbacks to the dual damascene process.

For instance, voids can form when filling the metal into the features, especially when feature sizes are scaled. The presence of voids undesirably leads to a higher contact resistance. Further, the presence of the barrier layer at the bottom of the vias also leads to a higher contact resistance.

Thus, improved via interconnect designs and techniques for formation thereof would be desirable.

SUMMARY OF THE INVENTION

The present invention provides a fully aligned via interconnect structure and techniques for formation thereof using subtractive metal patterning. In one aspect of the invention, an interconnect structure is provided. The interconnect structure includes: metal lines Mx−1; metal lines Mx disposed over the metal lines Mx−1; and at least one via Vx−1 fully aligned between the metal lines Mx−1 and the metal lines Mx, wherein a top surface of at least one of the metal lines Mx−1 has a stepped profile.

For instance, the stepped profile can include a first region of the top surface of the at least one metal line Mx−1 at a base of the at least one via Vx−1 that is above a second region of the top surface of the at least one metal line Mx−1 away from the at least one via Vx−1. Alternatively, the stepped profile can include a first region of the top surface of the at least one metal line Mx−1 at a base of the at least one via Vx−1 that is below a second region of the top surface of the at least one metal line Mx−1 away from the at least one via Vx−1.

In another aspect of the invention, another interconnect structure is provided. The interconnect structure includes: metal lines Mx−1; metal lines Mx disposed over the metal lines Mx−1; at least one via Vx−1 fully aligned between the metal lines Mx−1 and the metal lines Mx; and sidewall spacers alongside the metal lines Mx. Pockets can be present in the at least one via Vx−1 and the metal lines Mx below the sidewall spacers, and a metal film is disposed in the pockets and along a sidewall of the at least one via Vx−1.

In another aspect of the invention, a method of forming an interconnect structure is provided. The method includes: forming by subtractive etch metal lines Mx−1 and at least one via Vx−1 self-aligned to at least one of the metal lines Mx−1 in an X-direction, wherein the X-direction is perpendicular to the metal lines Mx−1; depositing an interlayer dielectric (ILD) over the metal lines Mx−1 and the at least one via Vx−1; depositing a metal layer onto the ILD over the at least one via Vx−1; and patterning by subtractive etch the metal layer to form metal lines Mx.

An overetch can be used during the patterning of the metal layer to etch the at least one via Vx−1 self-aligning the at least one via Vx−1 to at least one of the metal lines Mx such that the at least one via Vx−1 is fully aligned between the metal lines Mx−1 and the metal lines Mx. Alternatively, sidewall spacers can be formed alongside the metal lines Mx. The at least one via Vx−1 can be etched between the sidewall spacers. Residual metal can be removed using an isotropic etch which forms pockets in the at least one via Vx−1 and the metal lines Mx below the sidewall spacers, and a metal film can be selectively grown in the pockets and along a sidewall of the at least one via Vx−1 self-aligning the at least one via Vx−1 to at least one of the metal lines Mx such that the at least one via Vx−1 is fully aligned between the metal lines Mx−1 and the metal lines Mx.

A more complete understanding of the present invention, as well as further features and advantages of the present invention, will be obtained by reference to the following detailed description and drawings.

DETAILED DESCRIPTION OF PREFERRED EMBODIMENTS

As provided above, the formation of interconnect structures having metal lines and vias using a dual damascene process can lead to void formation and the presence of a barrier layer at the sidewall and bottom of the via, both of which can undesirably lead to an increase in contact resistance. Advantageously, provided herein are interconnect structures having fully aligned vias formed using subtractive metal patterning. A subtractive metal patterning approach altogether avoids the challenges such as void formation that are associated with filling high-aspect ratio features with metal. By 'fully aligned' it is meant that the vias are aligned to metal lines that extend along an x-direction and metal lines that extend along a y-direction above and below (or vice versa) the vias.

Figure 1:
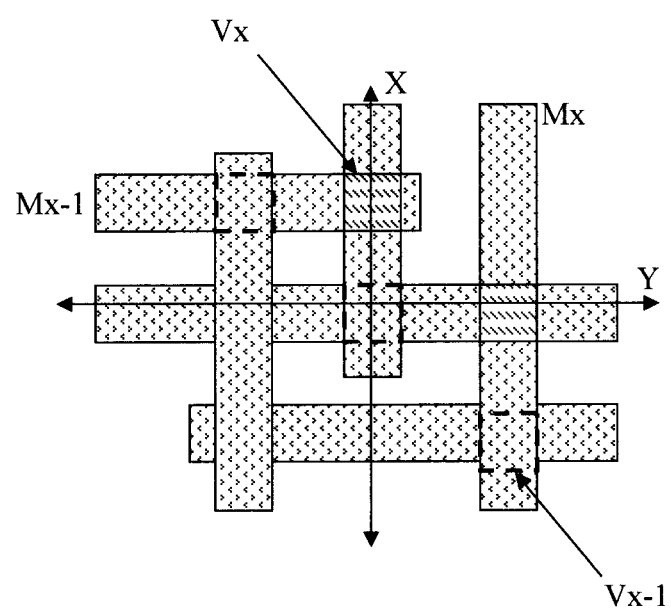
FIG. 1 is a top-down view of the general interconnect design presented herein having lower metal lines Mx−1, upper metal lines Mx oriented parallel to the lower metal lines Mx−1, lower vias Vx−1 fully aligned between the lower metal lines Mx−1 and upper metal lines Mx, and upper vias Vx self-aligned over the upper metal lines Mx according to an embodiment of the present invention.

An exemplary subtractive patterning methodology for forming an interconnect structure in accordance with the present techniques is now described by way of reference to FIGS. 1-6. In each of the following figures, a cross-sectional view through a part of the interconnect structure will be depicted. See, for example, FIG. 1 which shows a top-down view of the general interconnect structure design illustrating the orientations of the various cuts through the structure that will be depicted in the figures. Referring to FIG. 1, in one exemplary embodiment, the present interconnect structure design includes lower metal lines Mx−1 and upper metal lines Mx oriented perpendicular to the lower metal lines Mx−1. Lower vias Vx−1 are fully aligned between the lower metal lines Mx−1 and upper metal lines Mx. Upper vias Vx are self-aligned over the upper metal lines Mx.

Figure 2A:
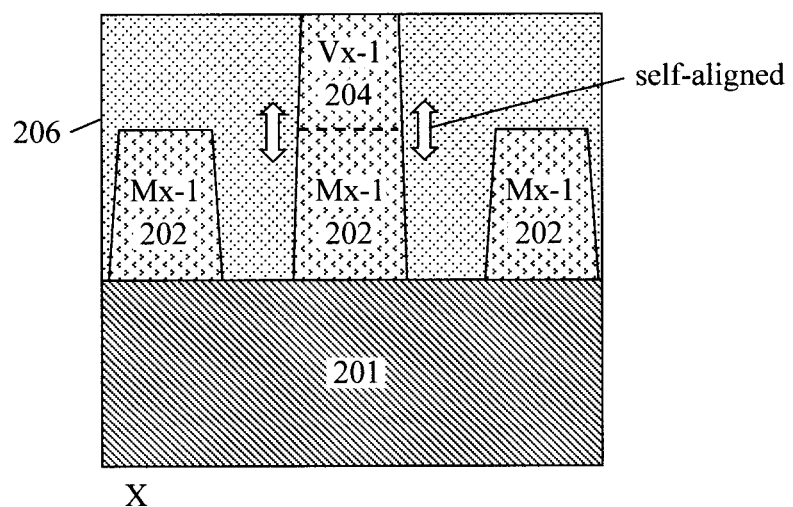
FIG. 2A is a cross-sectional diagram illustrating lower metal lines Mx−1 having been patterned on a substrate, at least one lower via Vx−1 (self-aligned in the X-direction, but larger in the Y-direction) having been patterned over the lower metal lines Mx−1, and a (first) interlayer dielectric (ILD) having been deposited over and surrounding the lower metal lines Mx−1 and lower via Vx−1 from a view X perpendicular to the lower metal lines Mx−1.

As shown in FIG. 1, a cross-section X will provide views of cuts perpendicular to the lower metal lines Mx−1 along one of the upper metal lines Mx. A cross-section Y will provide views of cuts along one of the lower metal lines Mx−1 perpendicular to the upper metal lines Mx. For instance, as shown in FIG. 2A (a cross-sectional view X), the process begins with the patterning of lower metal lines Mx−1 202 on a substrate 201 and the patterning of at least one lower via Vx−1 204 over the lower metal lines Mx−1 202. For illustrative purposes only, a dashed line is used to delineate the lower metal line Mx−1 202 from the via Vx−1 204 in this view. However, the lower the metal line Mx−1 202 and the via Vx−1 204 are patterned from the same metal layer (see below) and thus are continuous structures without any interface therebetween.

According to an exemplary embodiment, substrate 201 is a bulk semiconductor wafer, such as a bulk silicon (Si), bulk germanium (Ge), bulk silicon germanium (SiGe) and/or bulk III-V semiconductor wafer. Alternatively, substrate 201 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 201 may already have pre-built structures (not shown) such as transistors, diodes, capacitors, resistors, interconnects, wiring, etc.

As highlighted above, a subtractive patterning approach is used to form the metal lines and vias in the present interconnect structure. To do so, a metal layer is first deposited onto substrate 201. Lithography and etching techniques are then used to pattern the metal layer into the individual lower metal lines Mx−1 202 and lower via Vx−1 204 shown in FIG. 2A. With lithography and etching processes, a lithographic stack (not shown), e.g., photoresist/organic planarizing layer (OPL)/anti-reflective coating (ARC), is used to pattern a hardmask (not shown) with the footprint and location of the lower metal lines Mx−1 202 and lower via Vx−1 204. Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern from the hardmask to the metal layer. The hardmask is then removed. A directional (anisotropic) etching process such as reactive ion etching (RIE) can be employed for the etch. As a result of this subtractive etching process, the lower metal lines Mx−1 202 and lower via Vx−1 204 have a distinct shape. Namely, due to the directional nature of the etch, the lower metal lines Mx−1 202 and lower via Vx−1 204 will have a tapered, downward sloping sidewall, such that the lower metal lines Mx−1 202 and lower via Vx−1 are each wider at the bottom and narrower at the top. Metal structures formed using a damascene process would not have this characteristic shape.

Suitable metals for the lower metal lines Mx−1 202 and lower via Vx−1 204 include, but are not limited to, cobalt (Co), ruthenium (Ru) molybdenum (Mo) and/or tungsten (W). It is notable that metals such as copper (Cu) are not easily patterned in this manner using a subtractive etch. Namely, Cu does not provide any volatile product while reacting with common etchant gases (fluorine, chlorine, oxygen, hydrogen etc.). As a result, it has a very slow etch rate to enable subtractive etching of Cu lines. Thus, alternative metals such as Co, Ru, Mo and/or W are preferable.

Following patterning of the lower metal lines Mx−1 202 and lower via Vx−1 204, an interlayer dielectric (ILD) 206 is deposited over and surrounding the lower metal lines Mx−1 202 and lower via Vx−1 204. Suitable ILDs include, but are not limited to, oxide low-κ materials such as silicon oxide ($SiO_x$) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as chemical vapor deposition (CVD), atomic layer deposition (ALD), or physical vapor deposition (PVD) can be used to deposit ILD 206, after which ILD 206 can be planarized using a process such as chemical mechanical polishing (CMP).

Figure 2B:
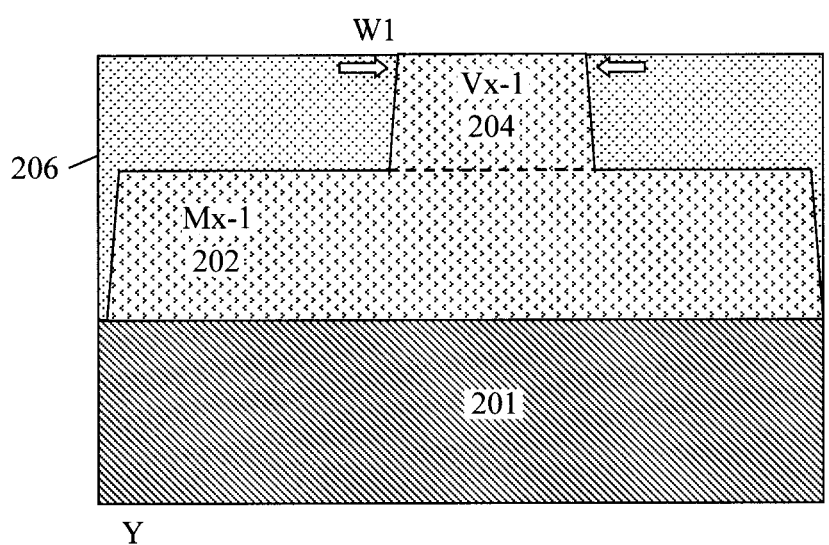
FIG. 2B is a cross-sectional diagram illustrating the lower metal lines Mx−1 having been patterned on the substrate, the lower via Vx−1 having been patterned over the lower metal lines Mx−1, and the first ILD having been deposited over and surrounding the lower metal lines Mx−1 and lower via Vx−1 from a view Y perpendicular to upper metal lines Mx according to an embodiment of the present invention.

As shown in FIG. 2A, the center lower metal line Mx−1 202 and lower via Vx−1 204 are self-aligned in the X-direction, i.e., perpendicular to the lower metal lines Mx−1 202. However, as shown in FIG. 2B (a cross-sectional view Y), instead of patterning a precise self-aligned via in the Y-direction, i.e., along the center lower metal line Mx−1 202, a large lower via Vx−1 204 is formed initially. Namely, at present, lower via Vx−1 204 is patterned having a width W1 in the Y-direction that is greater than the width of the upper metal line Mx that will be formed over the lower via Vx−1 204. However, the subsequent subtractive etch during patterning of the upper metal line Mx (see below) will be used to self-align the lower via Vx−1 204 to the corresponding upper metal line Mx.

Figure 3A:
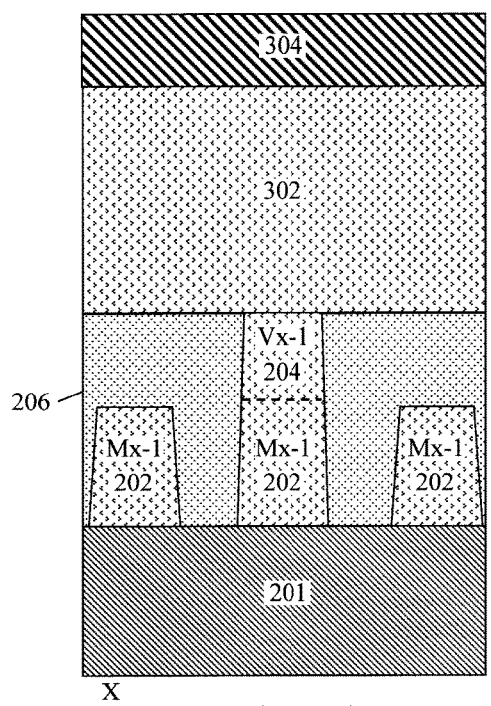
FIG. 3A is a cross-sectional diagram illustrating a metal layer for the upper metal lines Mx having been deposited onto the first ILD over, and in direct contact with the lower via Vx−1, and a hardmask having been deposited onto the metal layer from a view X perpendicular to the lower metal lines Mx−1.

As shown in FIG. 3A (a cross-sectional view X), a metal layer 302 for the upper metal lines Mx and upper via Vx is deposited onto ILD 206 over, and in direct contact with the lower via Vx−1 204. As provided above, suitable metals include, but are not limited to, Co, Ru and/or W. A process such as evaporation, sputtering or electrochemical plating can be employed to deposit metal layer 302. Following deposition, the metal layer 302 can be planarized using a process such as CMP.

Figure 3B:
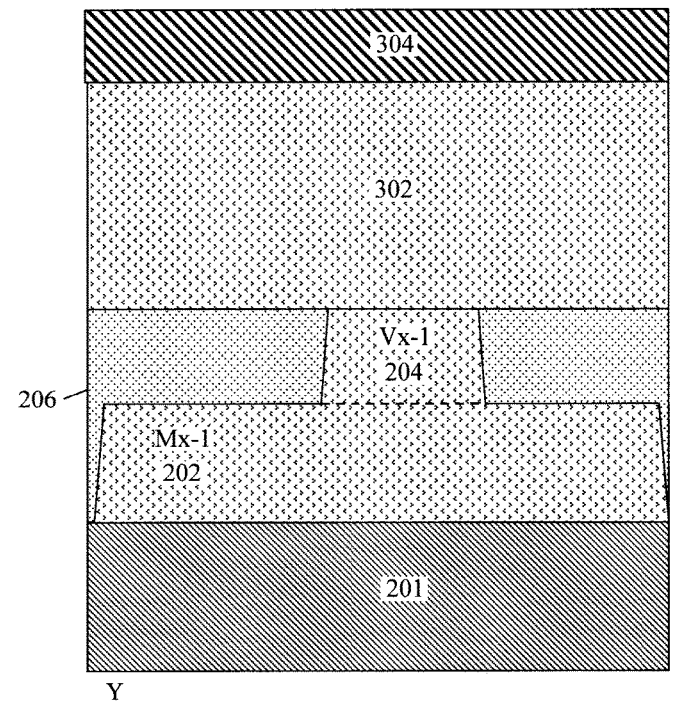
FIG. 3B is a cross-sectional diagram illustrating the metal layer for the upper metal lines Mx having been deposited onto the first ILD over, and in direct contact with the lower via Vx−1, and the hardmask having been deposited onto the metal layer from a view Y perpendicular to upper metal lines Mx according to an embodiment of the present invention.

A hardmask 304 is then deposited onto the metal layer 302. Suitable hardmask materials include, but are not limited to, nitride hardmask materials such as silicon nitride (SiN), silicon oxynitride (SiON), silicon carbide nitride (SiCN), and/or oxide hardmask materials such as silicon oxide (SiOx). A process such as CVD, ALD or PVD can be employed to deposit the hardmask 304. FIG. 3B (a cross-sectional view Y), illustrates the metal layer 302 for the upper metal lines Mx having been deposited onto the ILD 206 over, and in direct contact with the lower via Vx−1 204, and the hardmask layer 304 having been deposited onto the metal layer 302 from another perspective.

Figure 4A:
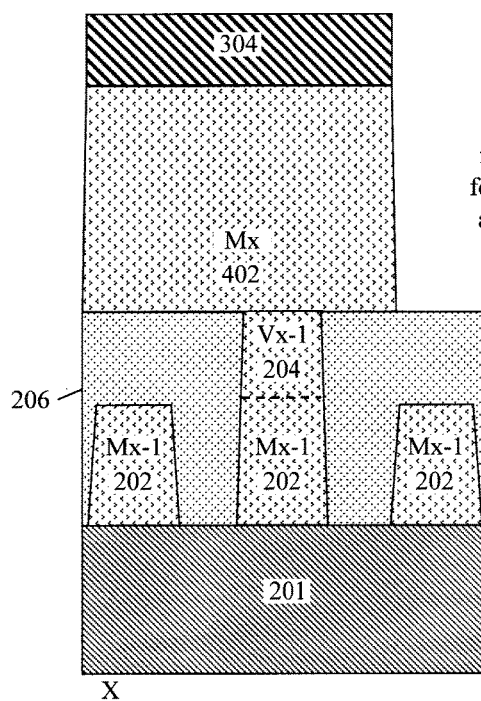
FIG. 4A is a cross-sectional diagram illustrating the hardmask having been patterned, and a subtractive etch having been used to transfer the pattern to the metal layer forming upper metal lines Mx from a view X perpendicular to the lower metal lines Mx−1.

As shown in FIG. 4A (a cross-sectional view X), lithography and etching techniques (see above) are then used to pattern the hardmask 304 with the footprint and location of the upper metal lines Mx. A subtractive etch, e.g., using RIE, is then used to transfer the pattern to metal layer 302, forming upper metal lines Mx 402. Following the etch, the hardmask 304 is removed. As a result of this subtractive etching process, the upper metal lines Mx 402 have a distinct shape. Namely, due to the directional nature of the etch, the upper metal lines Mx 402 will have a tapered, downward sloping sidewall such that the upper metal lines Mx 402 are each wider at the bottom and narrower at the top.

Figure 4B:
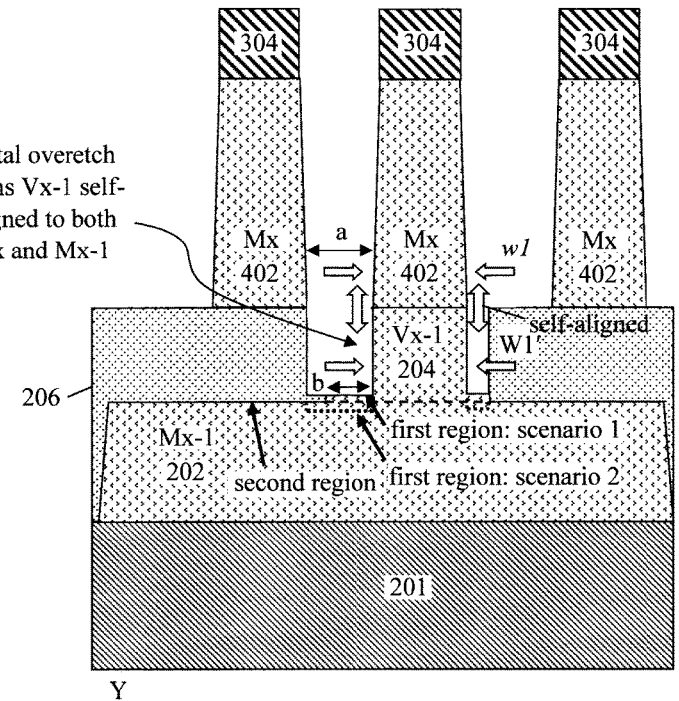
FIG. 4B is a cross-sectional diagram illustrating the hardmask having been patterned, and the subtractive etch having been used to transfer the pattern to the metal layer forming the upper metal lines Mx, whereby the metal overetch from this patterning process etches the lower via Vx−1, self-aligning the lower via Vx−1 to the upper metal lines Mx (in the Y-direction) from a view Y perpendicular to upper metal lines Mx according to an embodiment of the present invention.

FIG. 4B (a cross-sectional view Y), illustrates the hardmask 304 having been patterned with the footprint and location of the upper metal lines Mx, and a subtractive etch having been used to transfer the pattern to metal layer 302, forming the upper metal lines Mx 402 from another perspective. As shown in FIG. 4B, the metal overetch from this patterning process etches the underlying lower via Vx−1 204, self-aligning the lower via Vx−1 204 to the center upper metal line Mx 402. Namely, as provided above, initially the lower via Vx−1 204 was intentionally formed having a larger width W1 than the upper metal lines Mx 402 in the Y-direction. Here, the overetch reduces the width of the lower via Vx−1 204 to W1', wherein W1'<W1, and wherein W1' is equal to a width w1 of the upper metal lines Mx 402. As provided above, lower via Vx−1 204 was already self-aligned to the corresponding lower metal line Mx−1 202. Thus, lower via Vx−1 204 is now self-aligned to both the lower metal line Mx−1 202 and the upper metal line Mx 402, i.e., lower via Vx−1 204 is fully aligned between the lower metal line Mx−1 202 and the upper metal line Mx 402.

As shown in FIG. 4B, due to the overetch process, the top surface of the corresponding lower metal line Mx−1 202 can have a unique stepped profile. Namely, in one scenario the overetch creates a first region of the top surface of lower metal line Mx−1 202 at a base of the lower via Vx−1 204 that is above a second region of the top surface of lower metal line Mx−1 202 away from the lower via Vx−1 204. Alternatively, in another scenario a greater depth of the overetch creates the first region of the top surface of lower metal line Mx−1 202 at a base of the lower via Vx−1 204 that is below a second region of the top surface of lower metal line Mx−1 202 away from the lower via Vx−1 204.

FIG. 4B further illustrates that when the Mx pitch is large, it is guaranteed that a>b. This ensures that the left upper metal line Mx 402 does not connect to a lower metal line Mx−1 202. Only the center upper metal line Mx 402 connects to the lower metal line Mx−1 202 through lower via Vx−1 204. However, as will be described in detail below, when the Mx pitch is small, sometimes with poor alignment, a can actually be smaller than b. This can result in shorts between the left upper metal line Mx and the lower metal line Mx−1. Advantageously, a process flow is provided below whereby that is avoided by removing the residual metal without shrinking the size of the lower via Vx−1.

Figure 5A:
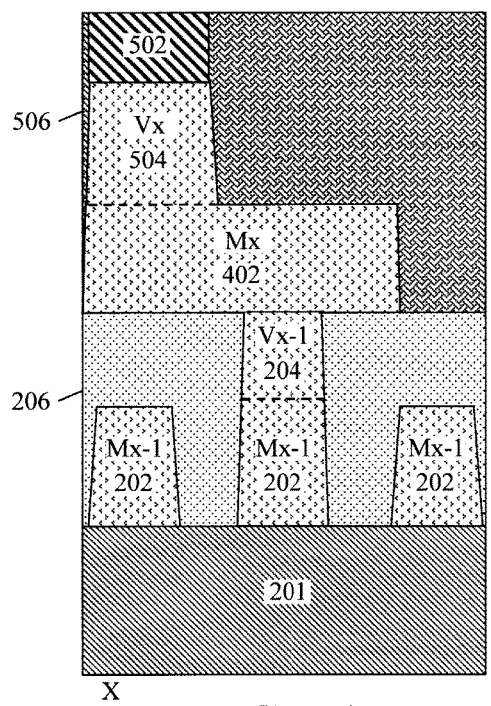
FIG. 5A is a cross-sectional diagram illustrating another hardmask having been patterned and a subtractive etch having been used to transfer the pattern to the upper metal lines Mx, forming at least one upper via Vx (larger in the X-direction), and a second ILD having been deposited over and surrounding the upper metal lines Mx, upper via Vx, and other hardmask from a view X perpendicular to the lower metal lines Mx−1.

As shown in FIG. 5A (a cross-sectional view X), lithography and etching techniques (see above) are then used to pattern a hardmask 502 with the footprint and location of at least one upper via Vx. As provided above, suitable hardmask materials include, but are not limited to, nitride hardmask materials such as SiN, SiON, SiCN, and/or oxide hardmask materials such as SiOx. A subtractive etch, e.g., using RIE, is then used to transfer the pattern to upper metal line Mx 402, forming at least one upper via Vx 504 over the corresponding upper metal line Mx 402. For illustrative purposes only, a dashed line is used to delineate the upper metal line Mx 402 from the upper via Vx 504 in this view. However, since the upper via Vx 504 is patterned from the upper metal line Mx 402 these are continuous structures without any interface therebetween. As a result of this subtractive etching process, the upper via Vx 504 has a distinct shape. Namely, due to the directional nature of the etch, the upper via Vx 504 will have a tapered, downward sloping sidewall such that the upper via Vx 504 is wider at the bottom and narrower at the top.

In the same manner as described above, instead of patterning a precise self-aligned via in the X-direction, a large upper via Vx 504 is formed initially. However, a subsequent subtractive etch during patterning of the next level of metal lines Mx+1 (not shown) can be used in the same manner as described above to self-align the upper via Vx 504 to the next level of metal lines in the X-direction. It is notable that the metal lines from one level to the next are perpendicular to one another. Namely, upper metal line Mx 402 are perpendicular to lower metal lines Mx−1 202. Likewise, metal lines Mx+1 will be perpendicular to the upper metal line Mx 402. Thus, upper via Vx 504 is initially formed larger in the X-direction, whereas lower via Vx−1 204 was initially formed larger in the Y-direction.

Following patterning of upper via Vx 504, an ILD 506 is deposited over and surrounding the upper metal lines Mx 402, upper via Vx 504, and hardmask 502. The terms 'first' and 'second' may also be used herein when referring to ILD 206 and ILD 506, respectively. As provided above, suitable ILDs include, but are not limited to, oxide low-κ materials such as SiOx and/or oxide ULK-ILD materials such as pSiCOH. A process such as CVD, ALD, or PVD can be used to deposit ILD 506, after which ILD 506 can be planarized using a process such as CMP.

Figure 5B:
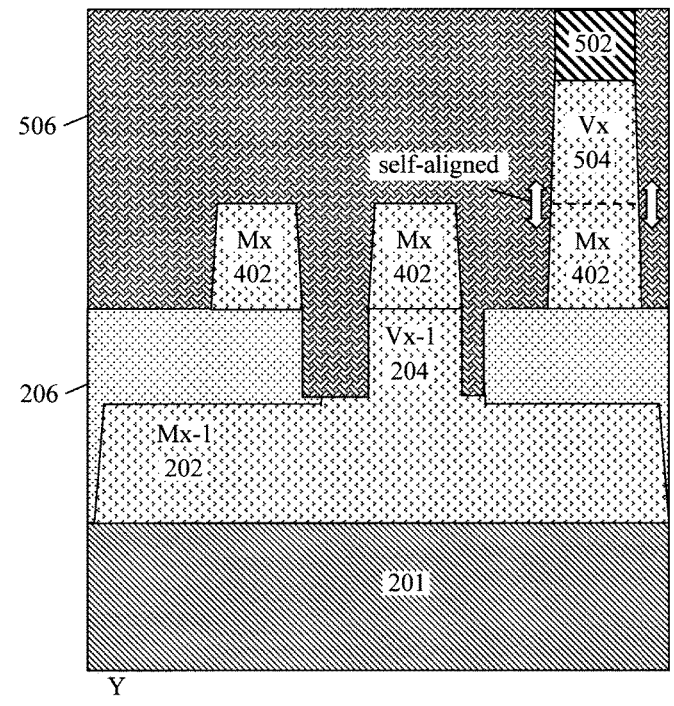
FIG. 5B is a cross-sectional diagram illustrating the other hardmask having been patterned and the subtractive etch having been used to transfer the pattern to the upper metal lines Mx, forming the upper via Vx self-aligned in the Y-direction, and a second ILD having been deposited over and surrounding the upper metal lines Mx, upper via Vx, and other hardmask from a view Y perpendicular to upper metal lines Mx according to an embodiment of the present invention.

FIG. 5B (a cross-sectional view Y) illustrates lithography and etching techniques having been used to pattern the hardmask 502 with the footprint and location of the at least one upper via Vx, the subtractive etch having been used to transfer the pattern to the upper metal line Mx 402, forming the at least one upper via Vx 504 over the corresponding upper metal line Mx 402, and the ILD 506 having been deposited over and surrounding the upper metal lines Mx 402, upper via Vx 504, and hardmask 502 from another perspective. As shown in FIG. 5B, the rightmost upper metal line Mx 402 and upper via Vx 504 are self-aligned in the Y-direction.

Figure 6A:
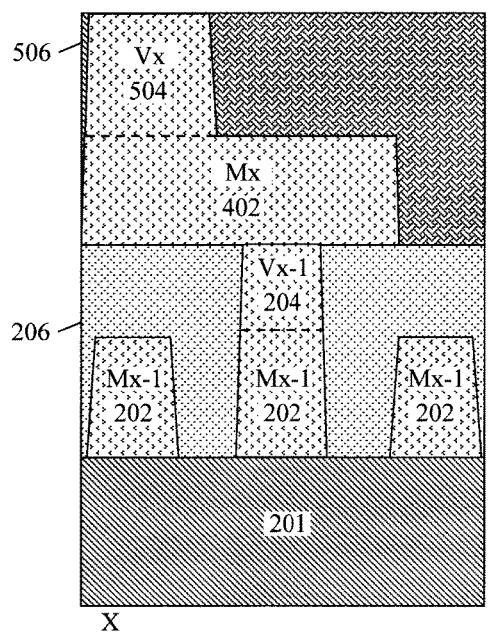
FIG. 6A is a cross-sectional diagram illustrating the other hardmask having been removed, and the second ILD having been planarized from a view X perpendicular to the lower metal lines Mx−1.
Figure 6B:
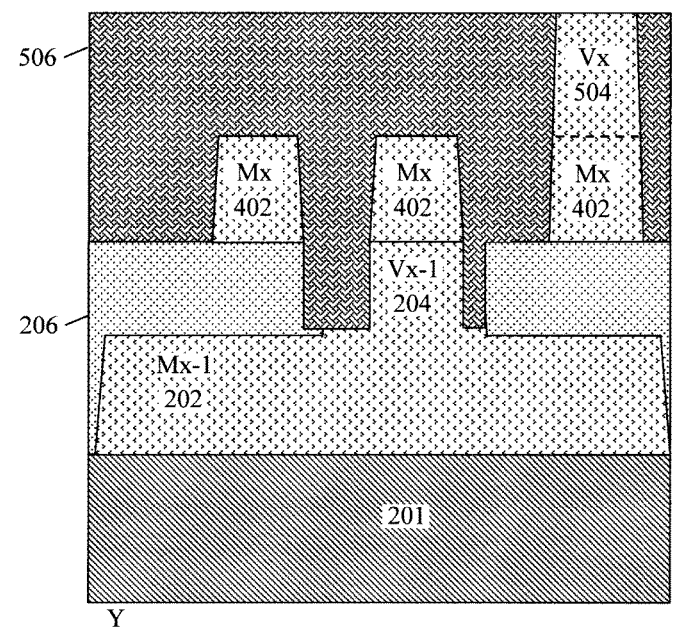
FIG. 6B is a cross-sectional diagram illustrating the other hardmask having been removed, and the second ILD having been planarized from a view Y perpendicular to upper metal lines Mx according to an embodiment of the present invention.

As shown in FIG. 6A (a cross-sectional view X), the hardmask 502 is removed. ILD 506 is then planarized using a process such as CMP. FIG. 6B (a cross-sectional view Y) illustrates the hardmask 502 having been removed, and the ILD 506 having been planarized from another perspective.

As an alternative to the embodiment just described, a thin sidewall spacer can be formed on the upper metal lines Mx prior to the etch that self-aligns the lower via Vx−1 to the upper metal line Mx in the Y-direction. Use of this sidewall spacer serves to protect the upper metal lines Mx especially in cases where the pitch of the metal lines Mx is extremely small (e.g., <25 nm), and can improve the edge placement window for the fully aligned via Vx−1. The term 'pitch' as used herein refers to the distance from one point on a metal line to the same point on an adjacent metal line. This alternative embodiment is now described by way of reference to FIGS. 7-15. In the description that follows, the orientations of the various X and Y cross-sectional views through the present interconnect structure are the same those depicted in FIG. 1, which is described in detail above.

Figure 7A:
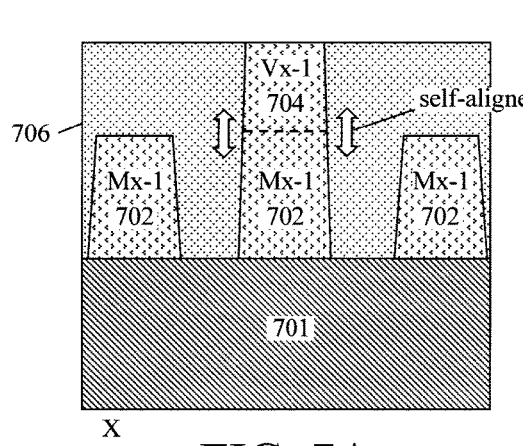
FIG. 7A is a cross-sectional diagram illustrating, according to an alternative embodiment, lower metal lines Mx−1 having been patterned on a substrate, at least one lower via Vx−1 (self-aligned in the X-direction, but larger in the Y-direction) having been patterned over the lower metal lines Mx−1, and a (first) ILD having been deposited over and surrounding the lower metal lines Mx−1 and lower via Vx−1 from a view X perpendicular to the lower metal lines Mx−1.

As shown in FIG. 7A (a cross-sectional view X), the process begins in the same general manner as the previous example with the patterning of lower metal lines Mx-1 702 on a substrate 701 and the patterning of at least one lower via Vx-1 704 over the lower metal lines Mx-1 702. For illustrative purposes only, a dashed line is used to delineate the lower the metal line Mx-1 702 from the via Vx-1 704 in this view. However, the lower the metal line Mx-1 702 and the via Vx-1 704 are patterned from the same metal layer (see below) and thus are continuous structures without any interface therebetween.

As above, substrate 701 can be a bulk semiconductor wafer (e.g., a bulk Si, bulk Ge, bulk SiGe and/or bulk III-V semiconductor wafer) or an SOI wafer with an SOI layer that includes any suitable semiconductor (e.g., Si, Ge, SiGe, and/or a III-V semiconductor). Substrate 701 may already have pre-built structures (not shown) such as transistors, diodes, capacitors, resistors, interconnects, wiring, etc.

In the same manner as described above, a subtractive patterning approach is used to form the metal lines and vias in the present interconnect structure whereby a metal layer (e.g., Co, Ru and/or W Co, Ru and/or W) is first deposited onto substrate 701. Lithography and etching techniques (see above) are then used to pattern the metal layer into the individual lower metal lines Mx-1 702 and lower via Vx-1 704 shown in FIG. 7A. A directional (anisotropic) etching process such as RIE can be employed for the etch. As a result of this subtractive etching process, the lower metal lines Mx-1 702 and lower via Vx-1 704 have a distinct shape. Namely, due to the directional nature of the etch, the lower metal lines Mx-1 702 and lower via Vx-1 704 will have a tapered, downward sloping sidewall, such that the lower metal lines Mx-1 702 and lower via Vx-1 704 are each wider at the bottom and narrower at the top.

An ILD 706 (e.g., SiOx and/or pSiCOH) is then deposited over and surrounding the lower metal lines Mx-1 702 and lower via Vx-1 704 using a process such as CVD, ALD, or PVD. Following deposition, the ILD 706 can be planarized using a process such as CMP.

Figure 7B:
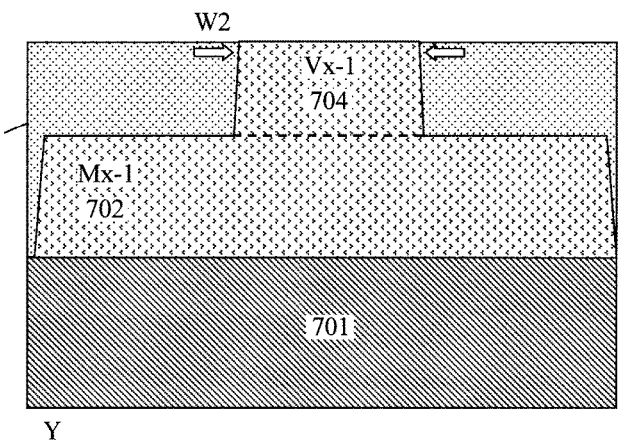
FIG. 7B is a cross-sectional diagram illustrating the lower metal lines Mx−1 having been patterned on the substrate, the lower via Vx−1 having been patterned over the lower metal lines Mx−1, and the first ILD having been deposited over and surrounding the lower metal lines Mx−1 and lower via Vx−1 from a view Y perpendicular to upper metal lines Mx according to an embodiment of the present invention.

As shown in FIG. 7A, the center lower metal line Mx-1 702 and lower via Vx-1 704 are self-aligned in the X-direction. However, as shown in FIG. 7B (a cross-sectional view Y), instead of patterning a precise self-aligned via in the Y-direction, a large lower via Vx-1 704 is initially formed having a width W2 in the Y-direction that is greater than the width of the upper metal line Mx that will be formed over the lower via Vx-1 704. However, an etch and selective metal growth following formation of the sidewall spacer (see below) will be used to self-align the lower via Vx-1 704 to the corresponding upper metal line Mx.

Figure 8A:
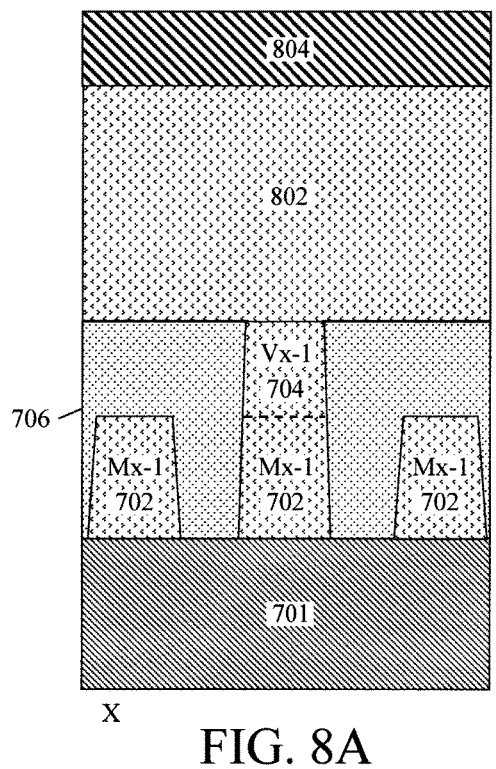
FIG. 8A is a cross-sectional diagram illustrating a metal layer for the upper metal lines Mx having been deposited onto the first ILD over, and in direct contact with the lower via Vx−1, and a hardmask having been deposited onto the metal layer from a view X perpendicular to the lower metal lines Mx−1.

As shown in FIG. 8A (a cross-sectional view X), a metal layer 802 for the upper metal lines Mx is deposited onto ILD 706 over, and in direct contact with the lower via Vx-1 704. As provided above, suitable metals include, but are not limited to, Co, Ru, Mo and/or W. A process such as evaporation, sputtering or electrochemical plating can be employed to deposit metal layer 802. Following deposition, the metal layer 802 can be planarized using a process such as CMP.

Figure 8B:
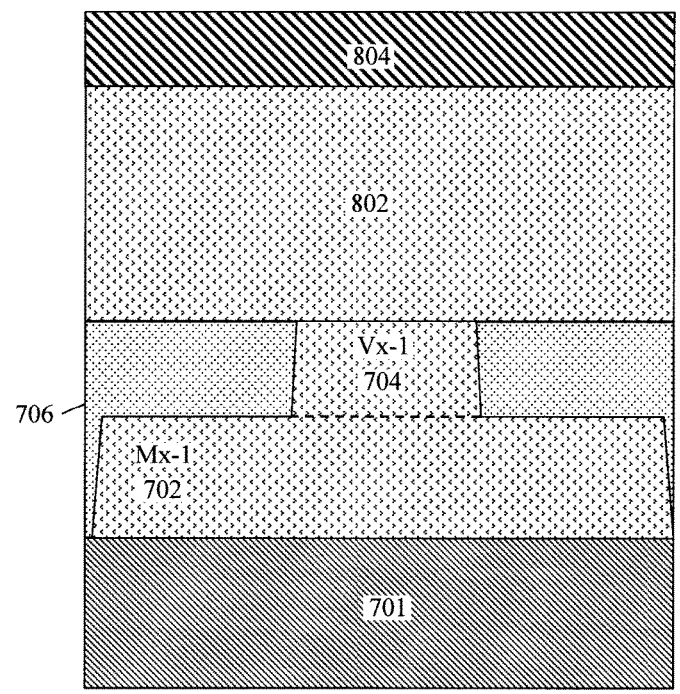
FIG. 8B is a cross-sectional diagram illustrating the metal layer for the upper metal lines Mx having been deposited onto the first ILD over, and in direct contact with the lower via Vx−1, and the hardmask having been deposited onto the metal layer from a view Y perpendicular to upper metal lines Mx according to an embodiment of the present invention.

A hardmask 804 is then deposited onto the metal layer 802. As provided above, suitable hardmask materials include, but are not limited to, nitride hardmask materials such as SiN, SiON, SiCN, and/or oxide hardmask materials such as SiOx. A process such as CVD, ALD or PVD can be employed to deposit the hardmask 804. FIG. 8B (a cross-sectional view Y), illustrates the metal layer 802 for the upper metal lines Mx having been deposited onto the ILD 706 over, and in direct contact with the lower via Vx-1 704, and the hardmask layer 804 having been deposited onto the metal layer 802 from another perspective.

Figure 9A:
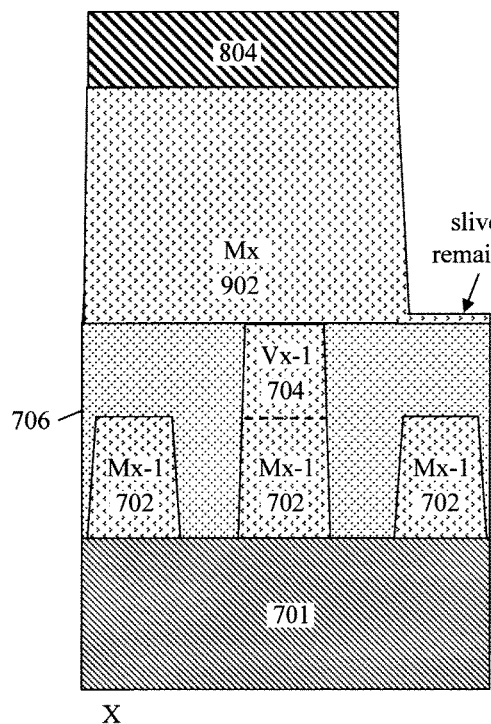
FIG. 9A is a cross-sectional diagram illustrating the hardmask having been patterned, and a subtractive etch stopping at or just above the first ILD having been used to transfer the pattern to the metal layer forming upper metal lines Mx from a view X perpendicular to the lower metal lines Mx−1.

As shown in FIG. 9A (a cross-sectional view X), lithography and etching techniques (see above) are then used to pattern the hardmask 804 with the footprint and location of the upper metal lines Mx. A subtractive etch, e.g., using RIE, is then used to transfer the pattern to metal layer 802, forming upper metal lines Mx 902. As a result of this subtractive etching process, the upper metal lines Mx 902 have a distinct shape. Namely, due to the directional nature of the etch, the upper metal lines Mx 902 will have a tapered, downward sloping sidewall such that the upper metal lines Mx 902 are each wider at the bottom and narrower at the top.

By comparison with the previous example, the metal etch of metal layer 802 stops on the ILD 706 or, as shown FIG. 9A just above the ILD 706, i.e., there is no overetch performed during the patterning of the upper metal lines Mx 902. Namely, referring to FIG. 9A it can be seen that a sliver of the metal layer 802 can remain on the ILD 706 in between the upper metal lines Mx 902. This remaining metal will be removed by a further metal etch (see below).

Figure 9B:
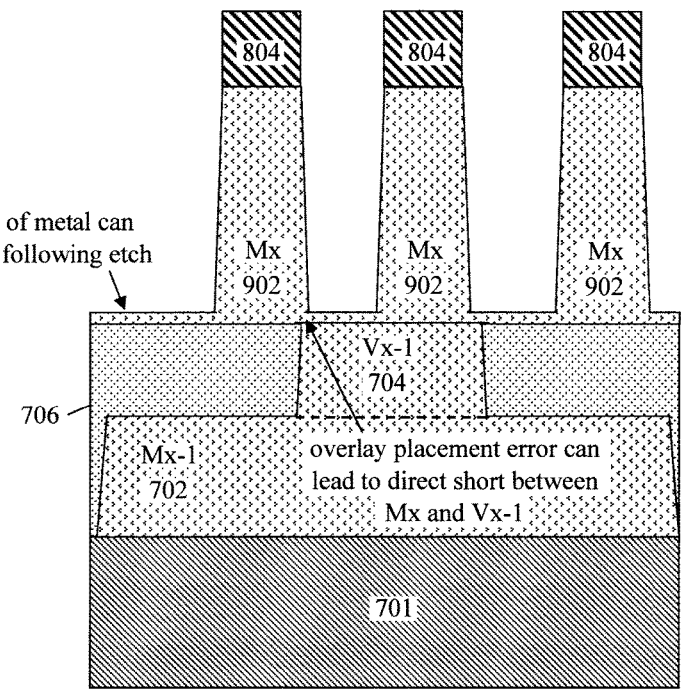
FIG. 9B is a cross-sectional diagram illustrating the hardmask having been patterned, and the subtractive etch stopping at or just above the first ILD having been used to transfer the pattern to the metal layer forming the upper metal lines Mx from a view Y perpendicular to upper metal lines Mx according to an embodiment of the present invention.

FIG. 9B (a cross-sectional view Y), illustrates the hardmask 804 having been patterned with the footprint and location of the upper metal lines Mx, and the subtractive etch having been used to transfer the pattern to metal layer 802, forming the upper metal lines Mx 902 from another perspective. FIG. 9B further illustrates how the etch of metal layer 802 stops on the ILD 706 or, as shown FIG. 9B just above the ILD 706, such that a sliver of the metal layer 802 can remain on the ILD 706 in between the upper metal lines Mx 902. As also illustrated in FIG. 9B, the pitch of the upper metal lines Mx 902 is so small such that an adjacent upper metal line Mx 902 (in this example the leftmost upper metal line Mx 902) can potentially short to the lower via Vx-1 704 in this worst-case scenario of overlay placement error. However, this connection will be broken by a further metal etch (see below).

Figure 10A:
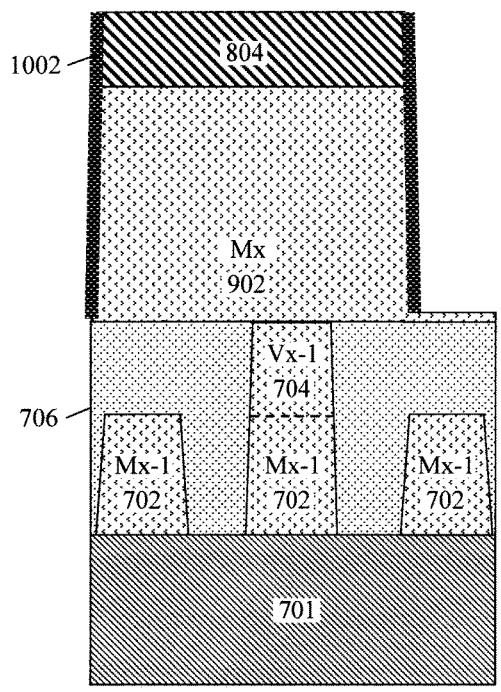
FIG. 10A is a cross-sectional diagram illustrating sidewall spacers having been formed alongside the upper metal lines Mx and hardmask from a view X perpendicular to the lower metal lines Mx−1.
Figure 10B:
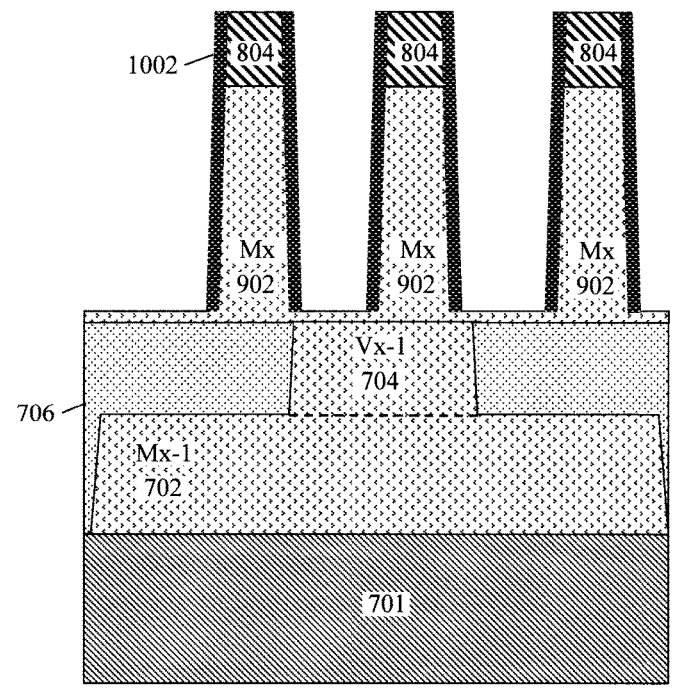
FIG. 10B is a cross-sectional diagram illustrating the sidewall spacers having been formed alongside the upper metal lines Mx and hardmask from a view Y perpendicular to upper metal lines Mx according to an embodiment of the present invention.

First however, thin sidewall spacers 1002 are formed alongside the upper metal lines Mx 902 and hardmask 804. See FIG. 10A (a cross-sectional view X). To form the sidewall spacers 1002, a suitable dielectric spacer material is first deposited over the upper metal lines Mx 902 and hardmask 804 using a process such as CVD, ALD or PVD. A directional (anisotropic) etching process such as RIE is then used to pattern the dielectric spacer material into the sidewall spacers 1002 alongside the upper metal lines Mx 902 and hardmask 804 shown in FIG. 10A. Suitable materials for sidewall spacers 1002 include, but are not limited to, SiOx, SiN, SiON and/or SiCN. According to an exemplary embodiment, sidewall spacers 1002 have a thickness of from about 1 nanometer (nm) to about 3 nm and ranges therebetween. As highlighted above, sidewall spacers 1002 will protect the upper metal lines Mx 902 during the subsequent processing steps. To look at it another way, without sidewall spacers 1002 the residual metal (see below) cannot be removed without damaging the upper metal lines Mx 902. FIG. 10B (a cross-sectional view Y), illustrates the sidewall spacers 1002 having been formed alongside the upper metal lines Mx 902 and hardmask 804 from another perspective.

Figure 11A:
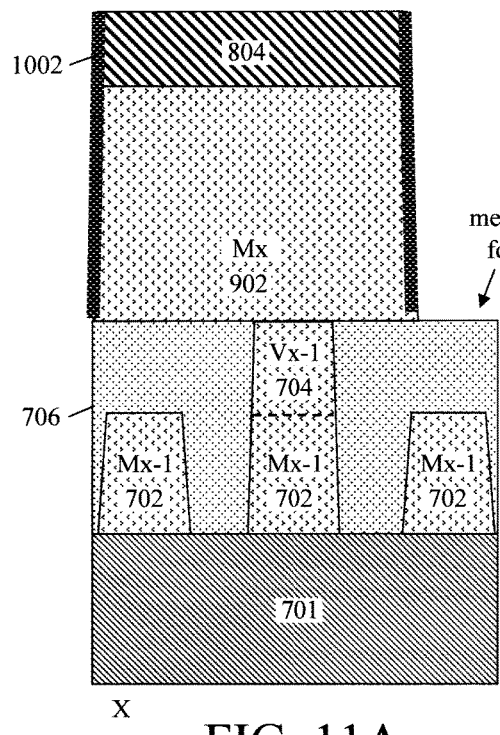
FIG. 11A is a cross-sectional diagram illustrating a follow-up (anisotropic) subtractive metal etch having been performed between the sidewall spacers to break connections to the lower via Vx−1 from a view X perpendicular to the lower metal lines Mx−1.

As shown in FIG. 11A (a cross-sectional view X), a follow-up subtractive metal etch is then performed using, e.g., a directional (anisotropic) etching process such as RIE, to break connections to the lower via Vx−1 704. Namely, in the view shown in FIG. 11A it can be seen that this follow-up etch removes any remaining sliver of metal over the ILD 706. Sidewall spacers 1002 protect the upper metal lines Mx 902 during this follow-up metal etch.

Figure 11B:
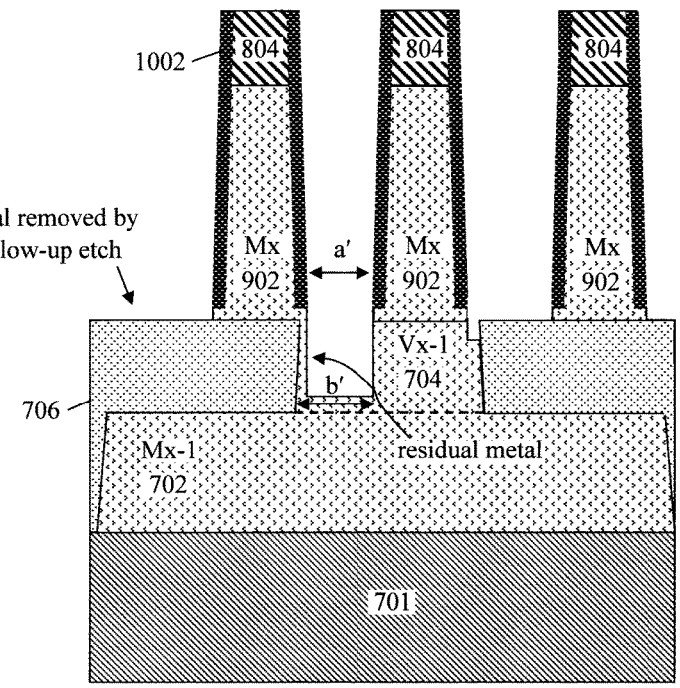
FIG. 11B is a cross-sectional diagram illustrating the follow-up (anisotropic) subtractive metal etch having been performed between the sidewall spacers to break the connections to the lower via Vx−1 from a view Y perpendicular to upper metal lines Mx according to an embodiment of the present invention.

FIG. 11B (a cross-sectional view Y) illustrates the follow-up metal etch having been performed from another perspective. As shown in FIG. 11B, since the follow-up etch is performed between the sidewall spacers 1002, some residual metal from lower via Vx−1 704 can be left directly connecting the lower metal lines Mx−1 702 to the upper metal lines Mx 902.

As provided above, in instances like this where the Mx pitch is small, sometimes with poor alignment, a' can actually be smaller than b'. This can result in shorts between the left upper metal line Mx 902 and the lower metal line Mx−1 702. However, the residual metal is next removed without shrinking the size of the lower via Vx−1 704.

Figure 12A:
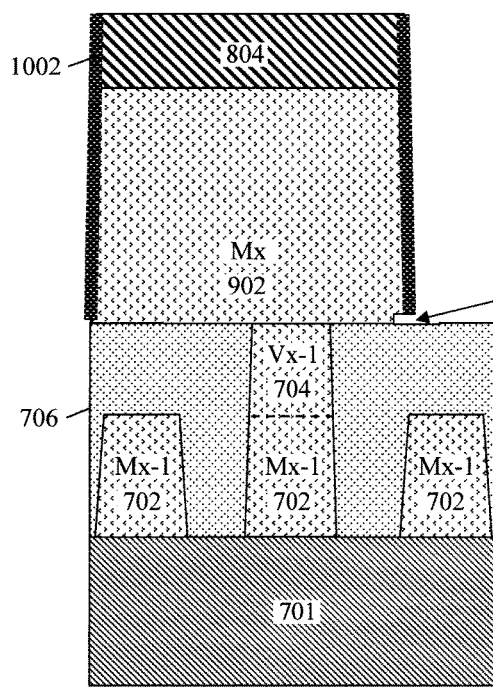
FIG. 12A is a cross-sectional diagram illustrating an isotropic etch having been performed to remove any residual metal creating pockets in the lower via Vx−1 and upper metal lines Mx along the ILD and below the sidewall spacers from a view X perpendicular to the lower metal lines Mx−1.
Figure 12B:
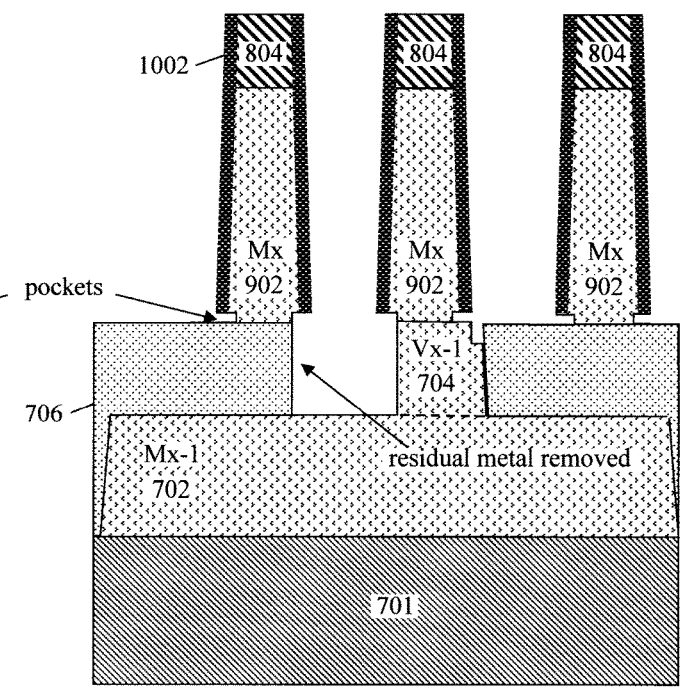
FIG. 12B is a cross-sectional diagram illustrating the isotropic etch having been performed to remove the residual metal creating the pockets in the lower via Vx−1 and upper metal lines Mx along the ILD and below the sidewall spacers from a view Y perpendicular to upper metal lines Mx according to an embodiment of the present invention.

Namely, a non-directional (isotropic) etch such as a wet chemical etch is next performed to remove the residual metal. See FIG. 12A (a cross-sectional view X). As shown in FIG. 12A, this isotropic etch removes exposed metal including the residual metal between the lower metal lines Mx−1 702 to the upper metal lines Mx 902. As also shown in FIG. 12A, this isotropic etch creates pockets in the lower via Vx−1 704 and upper metal lines Mx 902 along the ILD 706 and below the sidewall spacers 1002. FIG. 12B illustrates the isotropic etch having been performed to remove the metal residue forming the pockets in the lower via Vx−1 704 and upper metal lines Mx 902 along the ILD 706 and below the sidewall spacers 1002 from another perspective.

Figure 13A:
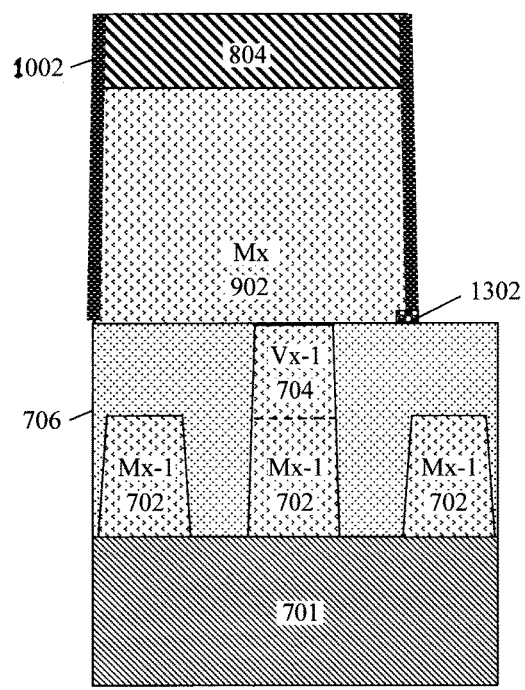
FIG. 13A is a cross-sectional diagram illustrating selective metal growth having been employed to deposit a metal film into the pockets and recover the size of the lower via Vx−1 from a view X perpendicular to the lower metal lines Mx−1.

As shown in FIG. 13A (a cross-sectional view X), selective metal growth is then employed to deposit a metal film 1302 into the pockets and thereby recover the size of the lower via Vx−1 704 reduced by the isotropic etch. Suitable metals for film 1302 include, but are not limited to, Co, Ru and/or W. Through this process, the metal film 1302 is grown only on the exposed metal surfaces including (as shown in this view) the exposed upper metal lines Mx 902 exposed within the pockets. By way of example only, a selective CVD process is employed whereby metal only nucleates over the metal surface and not over dielectrics such as $SiO_2$, SiN, etc. Notably, while metal film 1302 can contain the same metal(s) as the lower metal lines Mx−1 702, lower via Vx−1 704, and upper metal lines Mx 902, this is not a requirement and embodiments are contemplated herein where metal film 1302 contains a different metal or combination of metals from at least one of the lower metal lines Mx−1 702, lower via Vx−1 704 and upper metal lines Mx 902.

Figure 13B:
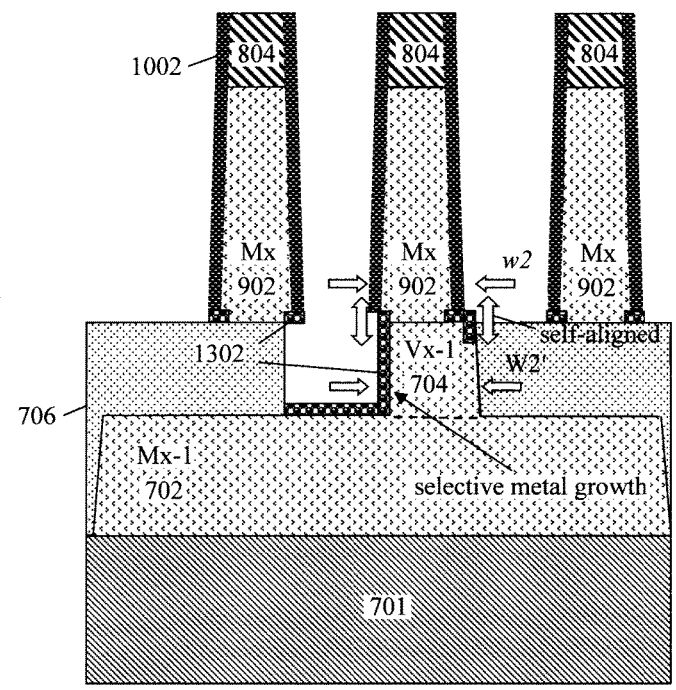
FIG. 13B is a cross-sectional diagram illustrating the selective metal growth having been employed to deposit the metal film into the pockets and recover the size of the lower via Vx−1 thereby self-aligning the lower via Vx−1 704 to the upper metal lines Mx in the Y-direction from a view Y perpendicular to upper metal lines Mx according to an embodiment of the present invention.

FIG. 13B (a cross-sectional view Y) illustrates the selective metal growth having been employed to deposit the metal film 1302 into the pockets from another perspective. As shown in FIG. 13B, metal film 1302 is grown on the exposed metal surfaces including those exposed surfaces of the lower via Vx−1 704 sidewall and upper metal lines Mx 902 exposed within the pockets, filling the pockets. Metal film 1302 also grows on the exposed surfaces of the lower metal lines Mx−1 702. As shown in FIG. 13B, this selective metal growth recovers the size of the lower via Vx−1 704 reduced by the isotropic etch from another perspective, thereby self-aligning the lower via Vx−1 704 to the center of the upper metal line Mx 902. Namely, as provided above, initially the lower via Vx−1 704 was intentionally formed having a larger width W2 than the upper metal lines Mx 902 in the Y-direction. Here, the follow-up (anisotropic) etch between the sidewall spacers 1002 (see FIGS. 11A and 11B), isotropic etch to remove the residual metal (see FIGS. 12A and 12B), and selective metal regrowth (see FIGS. 13A and 13B) reduces the width of the lower via Vx−1 704 to W2', wherein W2'<W2, and wherein W2' is equal to a width w2 of the upper metal lines Mx 902. As provided above, lower via Vx−1 704 was already self-aligned to the corresponding lower metal line Mx−1 702. Thus, lower via Vx−1 704 is now self-aligned to both the lower metal line Mx−1 702 and the upper metal line Mx 902, i.e., lower via Vx−1 704 is fully aligned between the lower metal line Mx−1 702 and the upper metal line Mx 902. Following the selective metal growth, the hardmask 804 is then removed.

Figure 14A:
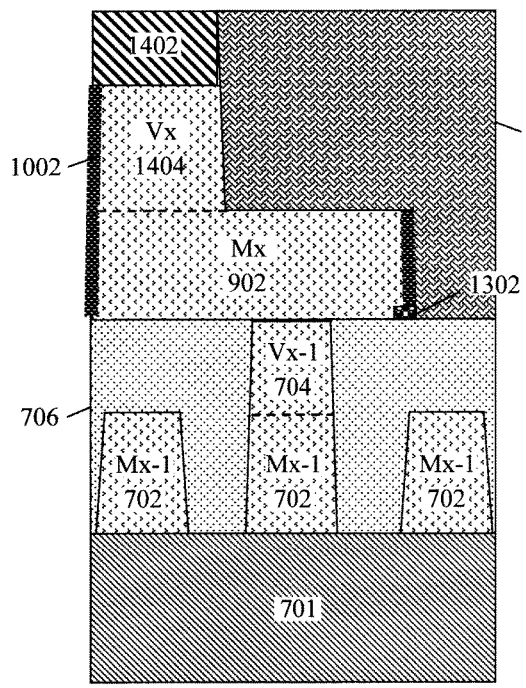
FIG. 14A is a cross-sectional diagram illustrating another hardmask having been patterned and a subtractive etch having been used to transfer the pattern to the upper metal lines Mx, forming at least one upper via Vx (larger in the X-direction), and a second ILD having been deposited over and surrounding the upper metal lines Mx, upper via Vx, and other hardmask from a view X perpendicular to the lower metal lines Mx−1.

As shown in FIG. 14A (a cross-sectional view X), lithography and etching techniques (see above) are then used to pattern a hardmask 1402 with the footprint and location of at least one upper via Vx. As provided above, suitable hardmask materials include, but are not limited to, nitride hardmask materials such as SiN, SiON, SiCN, and/or oxide hardmask materials such as SiOx. A subtractive etch, e.g., using RIE, is then used to transfer the pattern to upper metal line Mx 902, forming at least one upper via Vx 1404 over the corresponding upper metal line Mx 902. For illustrative purposes only, a dashed line is used to delineate the upper metal line Mx 902 from the upper via Vx 1404 in this view. However, since the upper via Vx 1404 is patterned from the upper metal line Mx 902 these are continuous structures without any interface therebetween. As a result of this subtractive etching process, the upper via Vx 1404 has a distinct shape. Namely, due to the directional nature of the etch, the upper via Vx 1404 will have a tapered, downward sloping sidewall such that the upper via Vx 1404 is wider at the bottom and narrower at the top.

In the same manner as described above, instead of patterning a precise self-aligned via in the X-direction, a large upper via Vx 1404 is formed initially. However, a subsequent subtractive etch during patterning of the next level of metal lines Mx+1 (not shown) can be used in the same manner as described above to self-align the upper via Vx 1404 to the next level of metal lines in the X-direction. It is notable that the metal lines from one level to the next are perpendicular to one another. Namely, upper metal lines Mx 902 are perpendicular to lower metal lines Mx−1 702. Likewise, metal lines Mx+1 will be perpendicular to the upper metal lines Mx 902. Thus, upper via Vx 1404 is initially formed larger in the X-direction, whereas lower via Vx−1 704 was initially formed larger in the Y-direction.

Following patterning of upper via Vx 1404, an ILD 1406 is deposited over and surrounding the upper metal lines Mx 902, upper via Vx 1404, and hardmask 1402. The terms 'first' and 'second' may also be used herein when referring to ILD 706 and ILD 1406, respectively. As provided above, suitable ILDs include, but are not limited to, oxide low-κ materials such as SiOx and/or oxide ULK-ILD materials such as pSiCOH. A process such as CVD, ALD, or PVD can be used to deposit ILD 1406, after which ILD 1406 can be planarized using a process such as CMP.

Figure 14B:
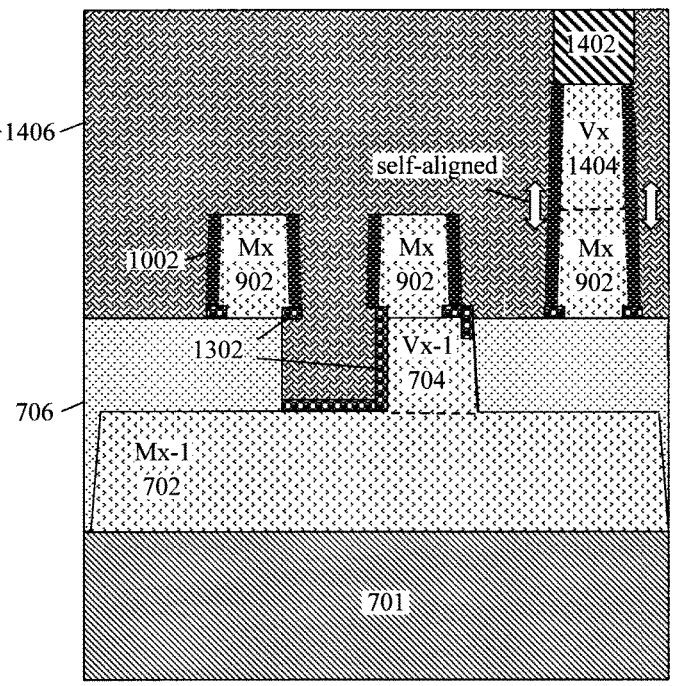
FIG. 14B is a cross-sectional diagram illustrating the other hardmask having been patterned and the subtractive etch having been used to transfer the pattern to the upper metal lines Mx, forming the upper via Vx self-aligned in the Y-direction, and a second ILD having been deposited over and surrounding the upper metal lines Mx, upper via Vx, and other hardmask from a view Y perpendicular to upper metal lines Mx according to an embodiment of the present invention.

FIG. 14B (a cross-sectional view Y) illustrates lithography and etching techniques having been used to pattern the hardmask 1402 with the footprint and location of the at least one upper via Vx, the subtractive etch having been used to transfer the pattern to the upper metal line Mx 902, forming the at least one upper via Vx 1404 over the corresponding upper metal line Mx 902, and the ILD 1406 having been deposited over and surrounding the upper metal lines Mx 902, upper via Vx 1404, and hardmask 1402 from another perspective. As shown in FIG. 14B, the rightmost upper metal line Mx 902 and upper via Vx 1404 are self-aligned in the Y-direction.

Figure 15A:
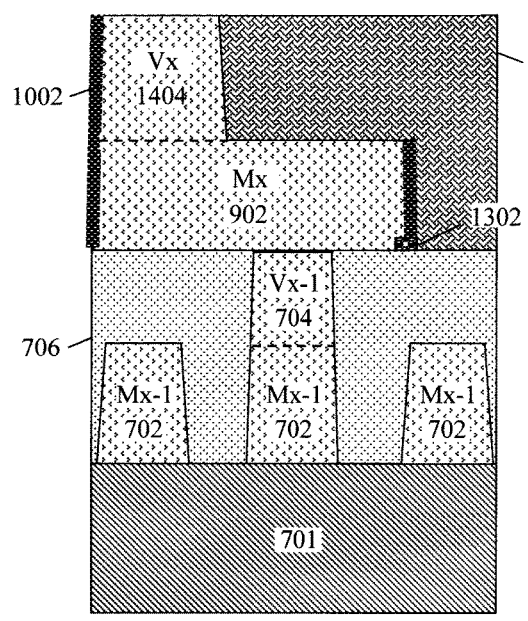
FIG. 15A is a cross-sectional diagram illustrating the other hardmask having been removed, and the second ILD having been planarized from a view X perpendicular to the lower metal lines Mx−1.
Figure 15B:
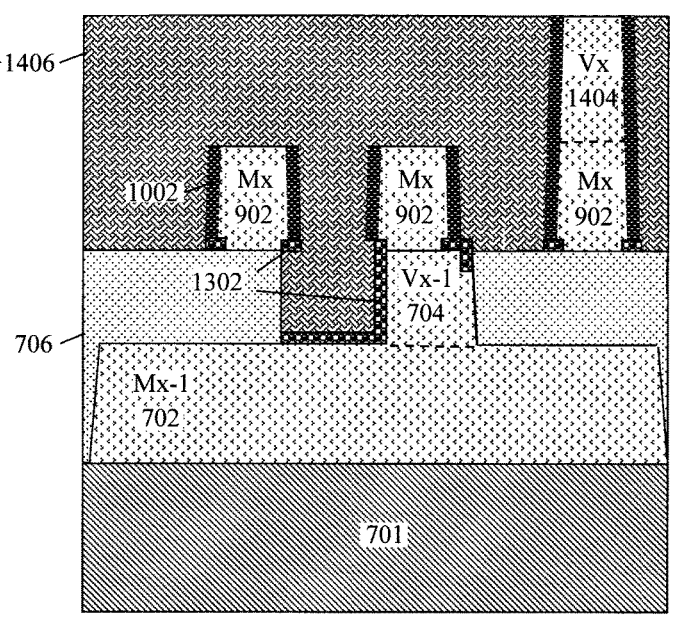
FIG. 15B is a cross-sectional diagram illustrating the other hardmask having been removed, and the second ILD having been planarized from a view Y perpendicular to upper metal lines Mx according to an embodiment of the present invention.

As shown in FIG. 15A (a cross-sectional view X), the hardmask 1402 is removed. ILD 1406 is then planarized using a process such as CMP. FIG. 15B (a cross-sectional view Y) illustrates the hardmask 1402 having been removed, and the ILD 1406 having been planarized from another perspective.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An interconnect structure, comprising:
    metal lines Mx−1;
    metal lines Mx disposed over the metal lines Mx−1; and
    at least one via Vx−1 fully aligned between the metal lines Mx−1 and the metal lines Mx, wherein a top surface of at least one of the metal lines Mx−1 has a stepped profile.

2. The interconnect structure of claim 1, wherein the metal lines Mx are oriented perpendicular to the metal lines Mx−1.

3. The interconnect structure of claim 1, wherein the stepped profile comprises a first region of the top surface of the at least one metal line Mx−1 at a base of the at least one via Vx−1 that is above a second region of the top surface of the at least one metal line Mx−1 away from the at least one via Vx−1.

4. The interconnect structure of claim 1, wherein the stepped profile comprises a first region of the top surface of the at least one metal line Mx−1 at a base of the at least one via Vx−1 that is below a second region of the top surface of the at least one metal line Mx−1 away from the at least one via Vx−1.

5. The interconnect structure of claim 1, wherein the metal lines Mx−1, the metal lines Mx, and the at least one via Vx−1 each has a tapered, downward sloping sidewall.

6. The interconnect structure of claim 1, wherein the metal lines Mx−1, the metal lines Mx, and the at least one via Vx−1 each comprises a metal selected from the group consisting of: cobalt (Co), ruthenium (Ru), molybdenum (Mo), tungsten (W) and combinations thereof.

7. An interconnect structure, comprising:
    metal lines Mx−1;
    metal lines Mx disposed over the metal lines Mx−1;
    at least one via Vx−1 fully aligned between the metal lines Mx−1 and the metal lines Mx; and
    sidewall spacers alongside the metal lines Mx but absent along the at least one via Vx−1.

8. The interconnect structure of claim 7, wherein the sidewall spacers comprise a material selected from the group consisting of: silicon oxide (SiOx), silicon nitride (SiN), silicon oxynitride (SiON), silicon carbide nitride (SiCN) and combinations thereof.

9. The interconnect structure of claim 7, further comprising:
    pockets in the at least one via Vx−1 and the metal lines Mx below the sidewall spacers; and
    a metal film disposed in the pockets and along a sidewall of the at least one via Vx−1.

10. The interconnect structure of claim 9, wherein the metal film contains a different metal from at least one of the metal lines Mx−1, the metal lines Mx, and the at least one via Vx−1.

11. The interconnect structure of claim 9, wherein the metal film is disposed on a top surface of at least one of the metal lines Mx−1.

12. The interconnect structure of claim 7, wherein the metal lines Mx are oriented perpendicular to the metal lines Mx−1.

13. The interconnect structure of claim 7, wherein the metal lines Mx−1, the metal lines Mx, and the at least one via Vx−1 each has a tapered, downward sloping sidewall.

14. The interconnect structure of claim 7, wherein the metal lines Mx−1, the metal lines Mx, and the at least one via Vx−1 each comprises a metal selected from the group consisting of: Co, Ru, Mo, W and combinations thereof.

* * * * *